United States Patent [19]

Smelser

[11] Patent Number: 5,099,484
[45] Date of Patent: Mar. 24, 1992

[54] MULTIPLE BIT ERROR DETECTION AND CORRECTION SYSTEM EMPLOYING A MODIFIED REED-SOLOMON CODE INCORPORATING ADDRESS PARITY AND CATASTROPHIC FAILURE DETECTION

[75] Inventor: Donald W. Smelser, Bolton, Mass.

[73] Assignee: Digital Equipment Corporation, Maynard, Mass.

[21] Appl. No.: 364,242

[22] Filed: Jun. 9, 1989

[51] Int. Cl.[5] .................... G06F 11/10; G11C 29/00; H03M 13/00
[52] U.S. Cl. ................................................ 371/38.1
[58] Field of Search .................. 371/38.1, 40.1, 40.2, 371/39.1, 37.7

[56] References Cited

U.S. PATENT DOCUMENTS

| Re. 28,421 | 5/1975 | Rouse | 235/153 |
|---|---|---|---|
| 3,231,858 | 1/1966 | Toumenokska et al. | 340/146.1 |
| 4,345,328 | 8/1982 | White | 371/38 |
| 4,375,664 | 3/1983 | Kim | 371/40.2 |
| 4,388,684 | 6/1983 | Nibby, Jr. et al. | 371/40.1 |
| 4,413,339 | 11/1983 | Riggle et al. | 371/38 |
| 4,567,594 | 1/1986 | Deodhar | 371/38 |
| 4,617,664 | 10/1986 | Aichelmann, Jr. et al. | 371/38 |
| 4,682,332 | 7/1987 | Okamoto et al. | 371/38 |
| 4,763,332 | 8/1988 | Glover | 371/40.2 |
| 4,852,100 | 7/1989 | Christensen et al. | 371/40.1 |
| 4,866,717 | 9/1989 | Murai et al. | 371/40.2 |

OTHER PUBLICATIONS

IEEE Transactions on Computers, vol. C-31, No. 7, Jul., 1982, pp. 596-602.
IBM Journal of Research & Development, vol. 28, No. 2, Mar., 1984, pp. 124-134.
IEEE Transactions on Information Theory, vol. IT-32, No. 2, Mar., 1986, pp. 181-185.
IEEE Transactions on Computers, vol. C-35, No. 7, Jul., 1986, pp. 646-648.

Primary Examiner—Jerry Smith
Assistant Examiner—Phung My Chung
Attorney, Agent, or Firm—Kenyon & Kenyon

[57] ABSTRACT

An error detection and correction scheme is provided utilizing a modified Reed-Solomon code which has been optimized to detect erroneous memory location accessing and catastrophic failure condition of data containing either all ones or all zeros for N-bit wide semiconductor random access memories. When data is written to memory, the scheme calculates a series of check bits to represent a data word and the address of the location that the data word is to be stored and stores that information in memory. When data is read from memory, a series of syndromes are calculated based upon the data read and its memory location. These syndromes are compared which enables the system to detect which symbol of the data word an error occurs and the corrected value of that symbol.

35 Claims, 13 Drawing Sheets

MODULO 2 ARITHMETIC

| | |
|---|---|
| 1+1=0 | 1*1=1 |
| 1+0=1 | 1*0=0 |
| 0+1=1 | 0*1=0 |
| 0+0=0 | 0*0=0 |
| (EXCLUSIVE OR) | (AND) |

FIG. 3

$$D(X) = D_4 X^4 = A^3 X^4 \qquad CW(X) = X^3(A^3 X^4) + CB_2 X^2 + CB_1 X + CB_0$$

$$A^3 X^4 + (A^3+A^2+1)X^3 + (A^3+A^2)X^2$$

$$X^3 + (A^2+A+1)X^2 + (A^3+A^2+A)X + A^3 \overline{\smash{\big)}\, A^3 X^7}$$

$$\underline{A^3 X^7 + (A^3+A^2+1)X^6 + (A^3+1)X^5 + (A^3+A^2)X^4}$$
$$(A^3+A^2+1)X^6 + (A^3+1)X^5 + (A^3+A^2)X^4$$
$$\underline{(A^3+A^2+1)X^6 + (A^2+1)X^5 + (A^3+A)X^4 + AX^3}$$
$$(A^3+A^2)X^5 + (A^2+A)X^4 + AX^3$$
$$\underline{(A^3+A^2)X^5 + \phantom{(}A\phantom{)}X^4 + A^2 X^3 + (A^3+A)X^2}$$
$$A^2 X^4 + (A+A^2)X^3 + (A^3+A)X^2$$
$$\underline{A^2 X^4 + (A^3+A^2+A+1)X^3 + (A^3+A^2+1)X^2 + (A^2+A)X}$$
$$(A^3+1)X^3 + (A^2+A+1)X^2 + (A^2+A)X$$
$$\underline{(A^3+1)X^3 + (A^3+A)X^2 + (A^2+A+1)X + A^2}$$
$$(A^3+A^2+1)X^2 + X + 0$$

REMAINDER ⟶ $(A^3+A^2+1)X^2 + X + A^2$ ie $\begin{cases} CB_2 = A^3+A^2+1 \\ CB_1 = 1 \\ CB_0 = A^2 \end{cases}$

IF A SINGLE SYMBOL ERROR IN SYMBOL $\phi$
THEN $A^\phi = 1$ ; $A^{2\cdot\phi} = 1$ $Q = P \Longrightarrow q_3 = p_3, q_2 = p_2, q_1 = p_1, q_0 = p_0$ $R = P \Longrightarrow r_3 = p_3, r_2 = p_2, r_1 = p_1, r_0 = p_0$

---

IF A SINGLE SYMBOL ERROR IN SYMBOL 1
THEN $A^1 = A;\ A^2 = A^2$ $Q = AP \Longrightarrow q_3 = p_2, q_2 = p_1, q_1 = p_0 + p_3, q_0 = p_3$ $R = A^2 P \Longrightarrow r_3 = p_1, r_2 = p_0 + p_3, r_1 = p_2 + p_3, r_0 = p_2$

---

IF A SINGLE SYMBOL ERROR IN SYMBOL 2
THEN $A^2 = A^2;\ A^{2\cdot 2} = A^4 = A + 1$ $Q = A^2 P;\ q_3 = p_1, q_2 = p_0 + p_3, q_1 = p_2 + p_3, q_0 = p_2$ $R = (A+1) P;\ r_3 = p_2 + p_3, r_2 = p_1 + p_2, r_1 = p_0 + p_1 + p_3, r_0 = p_0 + p_3$

---

IF A SINGLE SYMBOL ERROR IN SYMBOL 3
THEN $A^3 = A^3;\ A^{3\cdot 2} = A^6 = A^3 + A^2$ $Q = A^3 P;\ q_3 = p_0 + p_3, q_2 = p_2 + p_3, q_1 = p_1 + p_2, q_0 = p_1$ $R = (A^3 + A^2) P;\ r_3 = p_0 + p_1 + p_3, r_2 = p_0 + p_2, r_1 = p_1 + p_3, r_0 = p_1 + p_2$

FIG. 4B

IF A SINGLE SYMBOL ERROR IN SYMBOL 4

THEN $A^4 = A+1$; $A^{2 \cdot 4} = A^8 = A^2+1$ $Q = (A+1)P \Longrightarrow q_3 = p_2+p_3, \; q_2 = p_1+p_2, \; q_1 = p_0+p_1+p_3, \; q_0 = p_0+p_3$ $R = (A^2+1)P \Longrightarrow r_3 = p_1+p_3, \; r_2 = p_0+p_2+p_3, \; r_1 = p_1+p_2+p_3, \; r_0 = p_0+p_2$

IF A SINGLE SYMBOL ERROR IN SYMBOL 5

THEN $A^5 = A^2+A$; $A^{2 \cdot 5} = A^{10} = A^2+A+1$ $Q = (A^2+A)P \Longrightarrow q_3 = p_1+p_2, \; q_2 = p_0+p_1+p_3, \; q_1 = p_0+p_2, \; q_0 = p_2+p_3$ $R = (A^2+A+1)P \Longrightarrow r_3 = p_1+p_2+p_3, \; r_2 = p_0+p_1+p_2+p_3, \; r_1 = p_0+p_1+p_2, \; r_0 = p_0+p_2+p_3$

IF A SINGLE SYMBOL ERROR IN SYMBOL 6

THEN $A^6 = A^3+A^2$; $A^{2 \cdot 6} = A^{12} = A^3+A^2+A+1$ $Q = (A^3+A^2)P \Longrightarrow q_3 = p_0+p_1+p_3, \; q_2 = p_0+p_2, \; q_1 = p_1+p_2, \; q_0 = p_1+p_2$ $R = (A^3+A^2+A+1)P \Longrightarrow r_3 = p_0+p_1+p_2, \; r_2 = p_0+p_1, \; r_1 = p_0, \; r_0 = p_0+p_1+p_2+p_3$

IF A SINGLE SYMBOL ERROR IN SYMBOL 7

THEN $A^7 = A^3+A+1$; $A^{2 \cdot 7} = A^{14} = A^3+1$ $Q = (A^3+\alpha+1)P \Longrightarrow q_3 = p_0+p_2, \; q_2 = p_1+p_3, \; q_1 = p_0+p_2+p_3, \; q_0 = p_0+p_1+p_2$ $R = (A^3+1)P \Longrightarrow r_3 = p_0, \; r_2 = p_3, \; r_1 = p_2, \; r_0 = p_0+p_1$

IF A SINGLE SYMBOL ERROR IN SYMBOL 8

THEN $A^8 = A^2+1$; $A^{2 \cdot 8} = A^{16} = A$ $Q = (A^2+1) \Longrightarrow q_3 = p_1+p_3, \; q_2 = p_0+p_2+p_3, \; q_1 = p_1+p_2+p_3, \; q_0 = p_0+p_2$ $R = AP \Longrightarrow r_3 = p_2, \; r_2 = p_1, \; r_1 = p_0+p_3, \; r_0 = p_3$

FIG. 4C

IF A SINGLE SYMBOL ERROR IN SYMBOL 9

THEN $A^9 = A^3 + A$;  $A^{2 \cdot 9} = A^{18} = A^3$ $Q = (A^3 + A) P \Longrightarrow q_3 = p_0 + p_2 + p_3,\ q_2 = p_1 + p_2 + p_3,\ q_1 = p_0 + p_1 + p_2 + p_3,\ q_0 = p_1 + p$ $R = A^3 P \Longrightarrow r_3 = p_0 + p_3,\ r_2 = p_2 + p_3,\ r_1 = p_1 + p_2,\ r_0 = p_1$

---

IF A SINGLE SYMBOL ERROR IN SYMBOL 10

THEN $A^{10} = A^2 + A + 1$;  $A^{2 \cdot 10} = A^{20} = A^5 = A^2 + A$ $Q = (A^2 + A + 1) P \Longrightarrow q_3 = p_1 + p_2 + p_3,\ q_2 = p_0 + p_1 + p_2 + p_3,\ q_1 = p_0 + p_1 + p_2,\ q_0 = p_0 + p_2 + p_3$ $R = (A^2 + A) P \Longrightarrow r_3 = p_1 + p_2,\ r_2 = p_0 + p_1 + p_3,\ r_1 = p_0 + p_2,\ r_0 = p_2 + p_3$

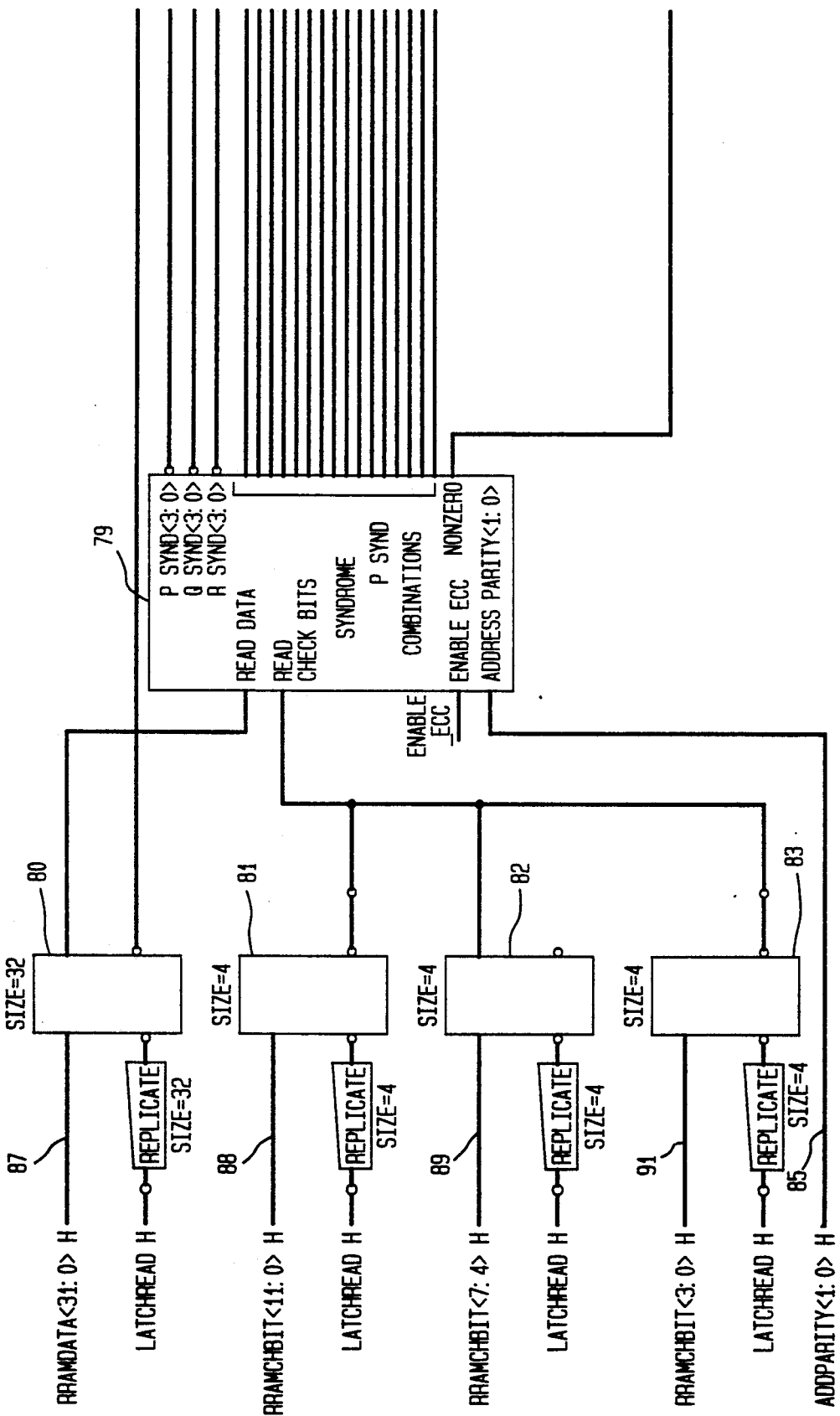

FIG. 8

```
CHECK SYMBOL NUMBER   0
  0 0   0 0 0 0 0 0 0 0 0 0 0 1
  0 1   0 0 0 0 0 0 0 0 0 0 1 0
  0 2   0 0 0 0 0 0 0 0 0 1 0 0
  0 3   0 0 0 0 0 0 0 0 1 0 0 0
CHECK SYMBOL NUMBER   1
  1 0   0 0 0 0 0 0 0 1 0 0 0 0
  1 1   0 0 0 0 0 0 1 0 0 0 0 0
  1 2   0 0 0 0 0 1 0 0 0 0 0 0
  1 3   0 0 0 0 1 0 0 0 0 0 0 0
CHECK SYMBOL NUMBER   2
  2 0   0 0 0 1 0 0 0 0 0 0 0 0
  2 1   0 0 1 0 0 0 0 0 0 0 0 0
  2 2   0 1 0 0 0 0 0 0 0 0 0 0
  2 3   1 0 0 0 0 0 0 0 0 0 0 0
DATA SYMBOL NUMBER   0
  3 0   0 1 1 1 1 1 1 0 1 0 0 0
  3 1   1 1 1 0 1 1 1 1 0 0 1 1
  3 2   1 1 1 1 1 1 0 1 0 1 1 0
  3 3   1 1 0 1 1 0 0 1 1 1 0 0
DATA SYMBOL NUMBER   1
  4 0   1 0 0 0 0 1 0 0 1 1 0 1
  4 1   0 0 1 1 1 0 0 0 1 0 0 1
  4 2   0 1 1 0 0 0 1 1 0 0 0 1
  4 3   1 1 0 0 0 1 1 0 0 0 1 0
DATA SYMBOL NUMBER   2
  5 0   1 0 0 1 0 1 0 0 1 1 0 0
  5 1   0 0 0 1 1 0 0 0 1 0 1 1
  5 2   0 0 1 0 0 0 1 1 0 1 0 1
  5 3   0 1 0 0 0 1 1 0 1 0 1 0
DATA SYMBOL NUMBER   3
  6 0   1 1 1 0 1 0 1 1 0 1 0 0
  6 1   1 1 1 1 0 1 0 1 1 0 0 0
  6 2   1 1 0 1 1 0 1 0 0 0 1 1
  6 3   1 0 0 1 0 1 1 1 0 1 1 0
DATA SYMBOL NUMBER   4
  7 0   0 1 1 1 1 1 1 1 1 0 0 1
  7 1   1 1 1 0 1 1 0 1 0 0 0 1
  7 2   1 1 1 1 0 0 1 0 0 1 0
  7 3   1 1 0 1 0 0 0 1 0 1 0 0
DATA SYMBOL NUMBER   5
  8 0   1 0 0 1 0 1 0 1 1 1 0 1
  8 1   0 0 0 1 1 0 1 0 1 0 0 1
  8 2   0 0 1 0 0 1 1 1 0 0 0 1
  8 3   0 1 0 0 1 1 1 0 0 0 1 0
DATA SYMBOL NUMBER   6
  9 0   1 1 1 1 1 0 1 0 0 1 0 0
  9 1   1 1 0 1 0 1 1 1 1 0 0 0
  9 2   1 0 0 1 1 1 1 0 0 0 1 1
  9 3   0 0 0 1 1 1 1 1 0 1 1 0
DATA SYMBOL NUMBER   7
 10 0   0 0 0 1 0 0 0 1 0 0 0 1
 10 1   0 0 1 0 0 0 1 0 0 0 1 0
 10 2   0 1 0 0 0 1 0 0 0 1 0 0
 10 3   1 0 0 0 1 0 0 0 1 0 0 0
```

Labels: 102 → row 6 3; 101 → row 7 0; MSB at row 7 1; LSB → 100 (right side of row 7 0).

FIG. 8A

```
DATA SYMBOL NUMBER   8
   11 0   0 1 1 0 1 1 1 1 0 0 0
   11 1   1 1 0 0 1 1 0 1 0 0 1 1
   11 2   1 0 1 1 1 0 0 1 0 1 1 0
   11 3   0 1 0 1 0 0 0 1 1 1 0 0
DATA SYMBOL NUMBER   9
   12 0   1 1 1 0 1 0 1 0 0 1 0 1
   12 1   1 1 1 1 0 1 1 1 1 0 1 0
   12 2   1 1 0 1 1 1 1 0 0 1 1 1
   12 3   1 0 0 1 1 1 1 1 1 1 1 0
DATA SYMBOL NUMBER  10
   13 0   0 1 1 0 1 1 1 0 1 0 0 1
   13 1   1 1 0 0 1 1 1 1 0 0 0 1
   13 2   1 0 1 1 1 1 0 1 0 0 1 0
   13 3   0 1 0 1 1 0 0 1 0 1 0 0
DATA SYMBOL NUMBER  11
   14 0   1 1 1 1 1 0 1 1 0 1 0 1
   14 1   1 1 0 1 0 1 0 1 1 0 1 0 ⎯111
   14 2   1 0 0 1 1 0 1 0 0 1 1 1 ⎯
   14 3   0 0 0 1 0 1 1 1 1 1 1 0 ⎯112

TOTAL   0 0 0 0 0 0 0 0 0 0 0 0

TOTAL   3 3 2 3 3 2 2 3 2 2 2 2

TOTAL   0 0 2 1 0 9 9 0 1 2 2 2
```

FIG. 9

```
CHECK SYMBOL NUMBER    0
  0 0   0 0 0 1 0 0 0 1 0 0 0 1
  0 1   0 0 1 0 0 0 1 0 0 0 1 0
  0 2   0 1 0 0 0 1 0 0 0 1 0 0
  0 3   1 0 0 0 1 0 0 0 1 0 0 0
CHECK SYMBOL NUMBER    1
  1 0   0 1 0 0 0 0 1 0 0 0 0 1
  1 1   1 0 0 0 1 0 0 0 0 0 1 0
  1 2   0 0 1 1 1 0 0 0 0 1 0 0
  1 3   0 1 1 0 0 0 1 1 1 0 0 0
CHECK SYMBOL NUMBER    2
  2 0   0 0 1 1 0 1 0 0 0 0 0 1
  2 1   0 1 1 0 1 0 0 0 0 0 1 0
  2 2   1 1 0 0 0 0 1 1 0 1 0 0
  2 3   1 0 1 1 0 1 1 0 1 0 0 0
DATA SYMBOL NUMBER    0
  3 0   1 1 0 0 1 0 0 0 0 0 0 1
  3 1   1 0 1 1 0 0 1 1 0 0 1 0
  3 2   0 1 0 1 0 1 1 0 0 1 0 0
  3 3   1 0 1 0 1 1 0 0 1 0 0 0
DATA SYMBOL NUMBER    1
  4 0   0 1 0 1 0 0 1 1 0 0 0 1
  4 1   1 0 1 0 0 1 1 0 0 0 1 0
  4 2   0 1 1 1 1 1 0 0 0 1 0 0
  4 3   1 1 1 0 1 0 1 1 1 0 0 0
DATA SYMBOL NUMBER    2
  5 0   0 1 1 1 0 1 1 0 0 0 0 1
  5 1   1 1 1 0 1 1 0 0 0 0 1 0
  5 2   1 1 1 1 1 0 1 1 0 1 0 0
  5 3   1 1 0 1 0 1 0 1 1 0 0 0
DATA SYMBOL NUMBER    3
  6 0   1 1 1 1 1 1 0 0 0 0 0 1
  6 1   1 1 0 1 1 0 1 1 0 0 1 0
  6 2   1 0 0 1 0 1 0 1 0 1 0 0
  6 3   0 0 0 1 1 0 1 0 1 0 0 0
DATA SYMBOL NUMBER    4
  7 0   1 0 0 1 1 0 1 1 0 0 0 1
  7 1   0 0 0 1 0 1 0 1 0 0 1 0
  7 2   0 0 1 0 1 0 1 0 0 1 0 0
  7 3   0 1 0 0 0 1 1 1 1 0 0 0
DATA SYMBOL NUMBER    5
  8 0   0 0 1 0 0 1 0 1 0 0 0 1
  8 1   0 1 0 0 1 0 1 0 0 0 1 0
  8 2   1 0 0 0 1 1 1 0 1 0 0
  8 3   0 0 1 1 1 1 1 0 1 0 0 0
DATA SYMBOL NUMBER    6
  9 0   1 0 0 0 1 0 1 0 0 0 0 1
  9 1   0 0 1 1 0 1 1 1 0 0 1 0
  9 2   0 1 1 0 1 1 1 0 0 1 0 0
  9 3   1 1 0 0 1 1 1 1 1 0 0 0
DATA SYMBOL NUMBER    7
 10 0   0 1 1 0 0 1 1 1 0 0 0 1
 10 1   1 1 0 0 1 1 1 0 0 0 1 0
 10 2   1 0 1 1 1 1 1 1 0 1 0 0
 10 3   0 1 0 1 1 1 0 1 1 0 0 0
```

FIG. 9A

```
DATA SYMBOL NUMBER   8
  11 0  1 0 1 1 1 1 1 0 0 0 0 1
  11 1  0 1 0 1 1 1 1 1 0 0 1 0
  11 2  1 0 1 0 1 1 0 1 0 1 0 0
  11 3  0 1 1 1 1 0 0 1 1 0 0 0
DATA SYMBOL NUMBER   9
  12 0  1 0 1 0 1 1 1 1 0 0 0 1
  12 1  0 1 1 1 1 1 0 1 0 0 1 0
  12 2  1 1 1 0 1 0 0 1 0 1 0 0
  12 3  1 1 1 1 0 0 0 1 1 0 0 0
DATA SYMBOL NUMBER   10
  13 0  1 1 1 0 1 1 0 1 0 0 0 1
  13 1  1 1 1 1 1 0 0 1 0 0 1 0
  13 2  1 1 0 1 0 0 0 1 0 1 0 0
  13 3  1 0 0 1 0 0 1 0 1 0 0 0
DATA SYMBOL NUMBER   11
  14 0  1 1 0 1 1 0 0 1 0 0 0 1
  14 1  1 0 0 1 0 0 0 1 0 0 1 0
  14 2  0 0 0 1 0 0 1 0 0 1 0 0  ←—— ADDPARITY<0>·
  14 3  0 0 1 0 0 1 0 0 1 0 0 0  ←—— ADDPARITY<1>

TOTAL  0 0 0 0 0 0 0 0 0 0 0 0
TOTAL  3 3 3 3 3 3 3 3 1 1 1 1
TOTAL  2 2 2 2 2 2 2 2 5 5 5 5
```

MULTIPLE BIT ERROR DETECTION AND CORRECTION SYSTEM EMPLOYING A MODIFIED REED-SOLOMON CODE INCORPORATING ADDRESS PARITY AND CATASTROPHIC FAILURE DETECTION

FIELD OF THE INVENTION

This invention relates to error detection and correction techniques for semiconductor memories and, more particularly, to a system which provides detection and correction of multiple bit errors in digital data. The invention provides a parallel system which employs a modified Reed-Solomon code which incorporates address and catastrophic data failure error detection.

BACKGROUND OF THE INVENTION

The computer industry has experienced a rapid evolution in technology, particularly in semiconductor memory capabilities. The increase in the densities of semiconductor memory chips, particularly random access memory (hereinafter "RAM") chips, has dramatically increased the amount of memory available in a computer system while reducing the number of memory chips required for a particular application. A drawback to this technological advance is that the increase in RAM chip densities has also resulted in a higher error rate.

Error correcting codes ("ECCs") have been used in semiconductor memory systems to increase reliability while maintaining data integrity. In prior ECC applications, memory array chips are usually organized so that errors generated in a chip failure can be corrected by the ECC. The standard memory array design utilizes a one-bit-per-chip organization. In this organization, each bit of a data word is stored in a different chip, thus, a 32 bit data word would require 32 memory chips. Any type of chip failure would corrupt only one bit of the data word.

Error correction for semiconductor memories has traditionally been accomplished with Hamming codes. Such codes are effective for isolated soft errors, i.e., random reversal of bits or hard errors, i.e., a permanently inoperative bit. These codes have the capability of single bit error correction and are easily extended to provide double bit error detection. Hamming codes are effective with memory arrays of a one-bit-per-chip configuration since most single RAM chip failures can only affect a single bit of the data word. However, with many recent architectures, it has become desirable to use four bit wide RAM chips. With four bit wide RAMs, several RAM failure mechanisms can result in two, three, or four bits in error. Accordingly, the traditional Hamming codes are less effective if four bit wide RAMs are used. The difficulty with an ECC in such a system is that if one chip fails, four data bits will be unreliable. The ECC of such a system must be able to correct four bits per chip in the 32 bit data word. The solution to this problem is to use an error correcting code optimized for correcting units of four bit quantities instead of one bit quantities. The class of error correcting codes known as Bose-Chaudhuri-Hocquenghem ("BCH") codes provides such an optimization. BCH codes are known to be capable of detecting and correcting multiple bit errors. Reed-Solomon codes, a subset of BCH codes, are also known to be capable of detecting and correcting multiple bit errors. The basic theoretical considerations pertinent to the use of Reed-Solomon codes for detecting and correcting data errors are set forth in W. W. Peterson and E. J. Weldon's book, *Error Correcting Codes*, published by the MIT Press, Cambridge, Massachusetts. Reed-Solomon codes are widely used for disk error correction because of their multiple burst error correction capability. However, for disk applications the correction algorithms are based on sequential state machines, or even software routines. The use of sequential logic or software routines in a semiconductor RAM application would be prohibitively slow.

To further increase the reliability and data integrity of a memory system, other means for detecting errors have also been employed. For example, a data word read from an incorrect memory location may be undetected by the ECC logic. Prior memory systems have included a separate address parity check which insures that data is read from the appropriate memory location. Without such a check, data read from an erroneous address could appear correct. A further error condition which may be undetected is the catastrophic condition of a data word containing all ones or all zeros.

While the prior art provides an adequate method of detecting and correcting errors in digital data, there is a need for advancement. In particular, in semiconductor memory systems comprising multiple-bits-per-chip memories, fast processing speed, reliability and data integrity are essential. Thus, it is imperative to provide an error correcting scheme which minimizes processing speed while increasing reliability and data integrity.

SUMMARY OF THE INVENTION

Accordingly, it is a primary objective of the present invention to provide an error correction and detection technique for semiconductor memory arrays which processes a data word from memory, in parallel, through combinatorial logic using a modified Reed-Solomon code which can detect and correct multiple-bit failures. This modified Reed-Solomon code has been adapted to also detect incorrect memory accesses (addressing) and catastrophic failures in the data word.

Generally, the present invention comprises a semiconductor memory array coupled by a bus arrangement to an error correction and detection logic device. Data words are stored in the memory array at separate locations identified by an address. In addition, check bits are stored in memory at the corresponding address where the appropriate data word is stored.

The present invention utilizes a modified Reed-Solomon code with a "symbol" size of four bits. A symbol represents a unit of bits for which the Reed-Solomon code detects and corrects errors. The data word consists of 32 data bits (eight symbols). Twelve check bits (three check symbols) including at least one address parity bit are appended to every data word, making the total word length 44 bits (eleven symbols). The code can correct one, two, three or four bits in error, as long as they are confined to a single symbol (single symbol error correction) and it can detect two through eight bits in error as long as they are confined to two symbols (double symbol error detection).

Before a data word is stored into memory, both the data word and the address of the location in memory where the data word is to be stored are passed through the error detection and correction logic device. This logic device performs calculations to generate the appropriate check bits for the data word and its corresponding address. The data word and check bits are then stored in the memory array.

When a data word is read from memory, a similar process occurs. The data word, its check bits, and the address generated to read the data word and check bits from memory, are passed through the error detection and correction logic device. The logic device performs calculations on the data word and check bits as read, and the address generated to read the data word. The results of these calculations are a plurality of syndrome equations. These syndromes are polynomial equations of varying degrees which are utilized by the logic device to determine if an error has occurred. If no error is detected, i.e., the syndromes are zero, the data word passes through the logic device and is available to the system for processing. If an error has occurred, the syndromes detect the symbol or symbols and the bit or bits in error. If the error is in only one symbol, the syndromes supply the correct value for the incorrect symbol. This corrected symbol replaces the erroneous symbol in the data word. The data word is then available for processing.

An important feature of the present invention is the address fault and catastrophic error detection. By encoding address parity information into the Reed-Solomon check symbols, the code can detect many common address faults. The catastrophic failures of all data bits equal to zero or one is detected by storing some of the check bits for each data word in complemented form. The present invention modifies the Reed-Solomon code so that catastrophic failures in the data words can be detected for all addresses.

BRIEF DESCRIPTION OF THE DRAWINGS

FIG. 3 is an illustration of how check symbols are determined by dividing the code word polynomial by the generator polynomial.

FIGS. 4A-4C are an expansion of the syndrome polynomials and their solutions to locate errors in a specific symbol.

FIGS. 8-8A are a check bit generation parity tree.

FIGS. 9-9A are a syndrome generation parity tree.

DETAILED DESCRIPTION

The present invention implements a modified Reed-Solomon code in parallel combinatorial logic to accomplish error detection and correction. The modification of the code is necessary in order to also detect an erroneous address being generated as well as the catastrophic failure of having the data word contain all ones or all zeros.

Figures 1, 2:
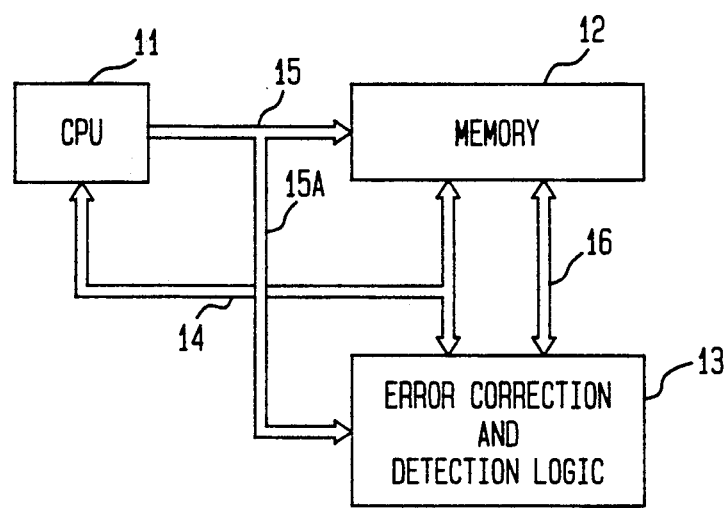
FIG. 1 is a block diagram of a computer system according to the present invention.
FIG. 2 is an illustration of modulo two arithmetic.

Referring now to the drawings, and initially to FIG. 1, there is illustrated, in block diagram form, the present invention. A central processing unit 11 (hereinafter "CPU") is coupled to a memory array 12 and error detection and correction logic device 13 via a bus 15 and a bus 14. The memory array 12 is coupled to the error detection and correction logic device 13 via the bus 14 and a bus 16. The bus 15 is an address bus which provides address information to the memory array 12 and the error detection and correction logic device 13. The bus 14 is a bidirectional data bus which carries a data word generated by the CPU 11 or read from the memory array 12. The bus 16 is a bidirectional bus which carries a plurality of check bits either generated by the error detection and correction logic device 13 or read from the memory array 12.

Before a data word is stored in the memory array 12 by the CPU 11, the data word and the address of the location in the memory array 12 where the data word will be stored are passed through the error detection and correction logic device 13. This logic device 13 performs a series of calculations on the data word and the address parity to generate check bits representative of the data word and address. The data word is then stored in the memory array 12 with the check bits generated by the error detection and correction logic device 13.

When the CPU 11 wants to read a data word from the memory array 12, the data word and its respective check bits are first passed through the error detection and correction logic device 13. The logic device 13 performs a series of calculations to generate a plurality of syndrome equations for the data word as received by the logic device 13 and for the address generated by the CPU to retrieve this data word. The calculated syndromes are compared with the data word and the check bits stored with the data word. If they are equal, the check bits are stripped away from the data word and the data word is then made available to the CPU 11. If, however, the solution of the syndrome equations are nonzero, the error may be corrected, or a flag may be set indicating an error has occurred.

To fully understand the calculations made to generate the check bits corresponding to a data word, a mathematical explanation of Reed-Solomon codes and how the code is modified in the present invention is required.

The arithmetic used in error correction is modulo two arithmetic. Referring to FIG. 2, there is illustrated the basic mathematical operation. Addition in modulo two is actually an exclusive OR operation as shown in the first column of FIG. 2. A multiplication function is a logical AND operation as shown in the second column of FIG. 2.

Reed-Solomon codes deal with symbols instead of bits. A symbol is a group of bits. In a preferred embodiment of the present invention, the memory array 12 comprises four bit wide RAMs, therefore, the symbol size is chosen to be four bits.

A mathematical means to express Reed-Solomon codes are Galois fields. In the preferred embodiment of the invention, a symbol size of four bits is utilized, therefore, the Galois field used is $GF(2^4)$.

A polynomial in x is constructed to deal with a data word to be stored in memory. The polynomial $D(x)$ 20 for the data word is set forth below. The data word is expressed in a polynomial with powers of x. The powers of x are place holders that indicate the weighted value of the data.

$$D(x) = D_7 x^7 + D_6 x^6 + D_5 x^5 + D_4 x^4 + D_3 x^3 + D_2 x^2 + D_1 x + D_0 \quad (20)$$

Check symbols are to be added to the data. Each data value in $D(x)$ 20 is a symbol. The check symbols are added to develop a code word which is also a polynomial CW)x) 21. The polynomial CW(x) 21, listed below, is obtained by raising D(x) 20 to an appropriate higher power and then adding in the checks symbols. Each of the data coefficients ($D_7$-$D_0$) and the check bit coefficients ($CB_2$-$CB_0$) represent four bit symbols.

$$CW(x) = x^3 (D(x)) + CB_2 x^2 + CB_1 x + CB_0 \quad (21)$$

The data and check bits in D(x) 20 and CW(x) 21 are four bit symbols that include zero and $GF(2^4)$. Thus, the symbols are all elements of $GF(2^4)$.

A generator polynomial G(x) 22 set forth below is selected. The variable A is selected to be the root of G(x) 22. Thus, if A were substituted for X in G(x) 22, the result would be zero. By substituting A into the G(x) 22 and adding $A^4$ to each side of the equation, equation 23 below is obtained. Equation 23 gives an expression for $A^4$.

$$G(x) = x^4 + x + 1 \quad (22)$$

$$A^4 + A + 1 \quad (23)$$

Set forth below in Table 1 are the powers of A. Table 1 is constructed by replacing $A^4$ with its equivalent expression (A+1) as shown in equation 23 of FIG. 3. The value of the powers of A start to repeat as shown at $A^{15}$ being equal to 1. The binary representations for this polynomial in A are included in FIG. 4. Interestingly, there are fifteen distinct binary numbers represented. Four bits in binary numbers can represent 0-15. Every member of the set of 0-15 is shown except all zeros. This table exemplifies the method by which the data symbols will be mapped into the Galois field, $GF(2^4)$. The binary representations are the values of a data word and the powers of A expression represents the entries in the Galois field that correspond to those data symbols.

TABLE 1

|  | Binary Representation |
| --- | --- |
| $A^0 = 1$ | 0001 |
| $A^1 = A$ | 0010 |
| $A^2 = A^2$ | 0100 |
| $A^3 = A^3$ | 1000 |
| $A^4 = A + 1$ | 0011 |
| $A^5 = A^2 + A$ | 0110 |
| $A^6 = A^3 + A^2$ | 1100 |
| $A^7 = A^3 + A + 1$ | 1011 |
| $A^8 = A^2 + 1$ | 0101 |
| $A^9 = A^3 + A$ | 1010 |
| $A^{10} = A^2 + A + 1$ | 0111 |
| $A^{11} = A^3 + A^2 + A$ | 1110 |
| $A^{12} = A^3 + A^2 + A + 1$ | 1111 |
| $A^{13} = A^3 + A^2 + 1$ | 1101 |
| $A^{14} = A^3 + 1$ | 1001 |
| $A^{15} = A^0 = 1$ | 0001 |

The Reed-Solomon code has a second generator polynomial $G_1(x)$ 24, listed below, with roots of one, A, and $A^2$ where A is an element from the Galois field $GF(2^4)$. By multiplying $G_1(x)$ 24 out, equation 25 set forth below is obtained. The check symbols of the code word are chosen so that the code word polynomial, CW(x) 21, will be evenly divisible by $G_1(x)$ 24. An equation 26 below illustrates the division of the code word by the $G_1(x)$ 24 polynomial showing the resulting remainder. This division gives a method for determining the check bits. The check bits are chosen so that the code word is evenly divisible by G(x) 24. Thus, by adding the remainder shown in equation 26 to $x^3 D(x)$, the division of the code word by $G_1(x)$ 24 will result in only a quotient with no remainder.

$$G_1(x) = (x+1)(x+A)(x+A^2) \quad (24)$$

$$G_1(x) = x^3 + (A^2+A+1)x^2 + (A^3+A^2+A)x + A^3 \quad (25)$$

Remainder $(x^3 D(x)/G(x)) = CB_2 x^2 + CB_1 x + CB_0 \quad (26)$

An example of the above division is shown in FIG. 3. The data polynomial D(x) 20 is chosen to be only one, non-zero symbol. The data symbol has only a single value in it, i.e., only $A^3 x^4$, not $A^3 + A^2$. The code word polynomial CW(x) 21 is shown to be $x^3$ times the data value ($A^3 x^4$) plus the check bits. The next step is to divide the generator polynomial $G_1(x)$ 25 into the data word. The long division is shown using substituted values for powers of A from Table 1, along with the resulting remainder. This remainder is the check bit polynomial which gives a value for check symbols zero to two ($CB_0$-$CB_2$) from the Galois field. Each check symbol is a four bit symbol which will be stored in memory in its corresponding binary representation of that element of the Galois field which is determined from Table 1.

The foregoing describes the mathematical technique that determines what the check bits will be for a corresponding data field. Each time a data word is to be stored or read from memory, it is divided by $G_1(x)$ 24 to ascertain the appropriate check bits for this particular data field.

The remainder resulting from the division of the code word polynomial by the generator polynomial can be calculated ahead of time for each position in the data word, if it is a one. That is, if one bit is a one and the rest are zeros, the check bits can be precalculated. The effect of having two bits being ones in the data field is to add (modulo two) the check bits for each of the bits as if only one of the bits were set. For each check bit position, a modulo two addition of some of the data bits from the data word is performed. These check bits are determined by performing the long division calculation shown in FIG. 3. Thus, parity trees are developed which are modulo two sums of data bits. Accordingly, the check bits are generated from these parity trees.

Errors which may occur in the memory system have two characteristics. Each error has a value and a location. To explain how the present invention handles errors, the value of an error is represented by the variable e which occurs in symbol J of the data word. The polynomial read is represented by RW(x) 40, set forth below, which equals the code word stored plus the error polynomial which consists of the error value times x to the power of J that defines the position in the polynomial where the error occurs. The code word polynomial CW(x) 21 has a power of x associated with each symbol. So if there is an error in a symbol, the error value times the power of x of that position is added to the code word read with the data.

$$RW(x) = CW(x) + ex^J \quad (40)$$

The code word polynomial CW(x) 21 was chosen to be evenly divisible by the generator polynomial $G_1(x)$ 24. Thus, some factor times the $G_1(x)$ 24 equals the code word polynomial CW(x) 21. Since CW(x) 21 is evenly divisible by $G_1(x)$ 24, they both have the same root values which are one, A, and $A^2$. Next, three equations set forth below are selected to represent a plurality of syndromes. These syndromes are P 41, Q 42, and R 43. By substituting the value of one for x into the P 41 syndrome, the P 41 syndrome is equal to the error. Thus, if P 41 is known, then the value of the error is known. Next A and $A^2$ are substituted for x into the Q 42 syndrome and the R 43 syndrome. The solutions of the syndromes are all members of the Galois field $GF(2^4)$.

$$P = RW(1) = CW(1) + e = e \quad (41)$$

$$Q = RW(A) = CW(A) + eA^J = eA^J \quad (42)$$

$$R = RW(A^2) = CW(A^2) + eA^{2J} = eA^{2J} \quad (43)$$

The syndrome calculations utilize multiplication on the Galois field $GF(2^4)$. Multiplication in the Galois field is illustrated below. Two arbitrary polynomials, B 44 and C 45, which are members of $GF(2^4)$ are selected. The coefficients of these polynomials, b and c, represent a binary value of either zero or one. Equation 46 represents the resulting product when the two polynomials are multiplied. For the higher powers of A, it is known from FIG. 4 that $A^4 = A + 1$, $A^5 32 A^2 + A$, and $A^6 = A^3 + A^2$. Thus, substituting these values in yields equation 47 which is a mathematical expression that can be implemented in combinatorial logic to perform the multiplication.

$$B = b_3 A^3 + b_2 A^2 + b_1 A + b_0 \quad (44)$$

$$C = c_3 A^3 + c_2 A^2 + c_1 A + c_0 \quad (45)$$

$$B^*C = b_3 c_3 A^6 + (b_3 c_2 + b_2 c_3) A^5 + (b_3 c_1 + \quad (46)$$

$$b_1 c_3 + b_2 c_2) A^4 + (b_3 c_0 + b_0 c_3 + b_2 c_1 + b_1 C_2) A^3 +$$

$$(b_2 c_0 + b_0 c_2 + b_1 c_1) A^2 + (b_1 c_0 + b_0 c_1) A + b_0 c_0$$

$$B^*C = (b_3 c_3 + b_3 c_0 + b_0 c_3 + b_2 c_1 + b_1 c_2) A^3 + \quad (47)$$

$$(b_3 c_3 + b_3 c_2 + b_2 c_3 + b_2 c_0 + b_0 c_2 + b_1 c_1) A^2 +$$

$$(b_3 c_2 + b_2 c_3 + b_3 c_1 + b_1 c_3 + b_2 c_2 + b_1 c_0 + b_0 c_1) A +$$

$$(b_3 c_1 + b_1 c_3 + b_2 c_2 + b_0 c_0)$$

Referring now to the equations below to illustrate how single symbol error values are calculated and how the errors are located, the syndromes P, Q, and R are listed in equations 48-50, in expanded form, with binary coefficients raised to various powers of A. If there is a single symbol error in symbol zero of the data word, then $A^0 = 1$ and $A^{2 \cdot 0} = 1$. This result means that Q must be equal to P as shown in equation 51 and R is equal to P as shown in equation 52.

$$P = e = P_3 A^3 + P_2 A^2 + P_1 A + P_0 \quad (48)$$

$$Q = eA^J = Q_3 A^3 + Q_2 A^2 + Q_1 A + Q_0 \quad (49)$$

$$R = eA^{2J} = R_3 A^3 + R_2 A^2 + RA + R_0 \quad (50)$$

$$Q = P \; Q_3 = P_3, \; Q_2 = P_2, \; Q_1 = P_1, \; Q_0 = P_0 \quad (51)$$

$$R = P \; R_3 = P_3, \; R_2 = P_2, \; R_1 = P_1, \; R_0 = P_0 \quad (52)$$

What is really being done is that equations 48 to 50 are being solved for e and J. Solving for e is simply solving for the value of the P syndrome.

If there is an error in symbol one of the data word, then $A^1 = A$ and $A^2 = A^2$. This result means that the Q syndrome is equal to A times the P syndrome and the R syndrome is equal to $A^2$ times the P syndrome. This process of having one error in the remaining symbols is illustrated in FIGS. 4A–4C. Thus, an error in a symbol gives a specific relationship between the bits in the P, Q and R syndromes. This process is equally applicable to the check bits as it is to the data word. In the preferred embodiment of the invention, the check bit symbols are placed in the least significant symbols of the data word, i.e., symbols zero, one and two.

In the preferred embodiment, eleven symbols are used as illustrated in FIGS. 4A–4C. In each case, the individual comparisons performed are comparing the individual Qs and Rs with combinations of the P syndrome bits. All fifteen possible combinations of the P syndrome bits are defined to be PC1 to PC15 and are shown below. All that is required is to compare these P syndrome combinations with the individual values of Qs and Rs for each symbol position to determine if there is an error in a respective symbol. The PC values set forth below have eliminated all overlapping of P values. Each bit in a data word including the check bits can contribute to the syndrome parity tree.

| | |
|---|---|
| PC1 = $P_0$ | PC9 = $P_3 + P_0$ |
| PC2 = $P_1$ | PC10 = $P_3 + P_1$ |
| PC3 = $P_0 + P_1$ | PC11 = $P_3 + P_1 + P_0$ |
| PC4 = $P_2$ | PC12 = $P_3 + P_2$ |
| PC5 = $P_2 + P_0$ | PC13 = $P_3 + P_2 + P_0$ |
| PC6 = $P_2 + P_1$ | PC14 = $P_3 + P_2 + P_1$ |
| PC7 = $P_2 + P_1 + P_0$ | PC15 = $P_3 + P_2 + P_1 + P_0$ |
| PC8 = $P_3$ | |

There are twelve syndrome bits, four bits for each syndrome. Each individual data bit can contribute to these syndrome bits by contributing to the parity tree that is developed. The parity trees are used to calculate the syndromes. This process of calculating the check bits and syndromes is done in parallel by utilizing these parity trees.

Figure 5:
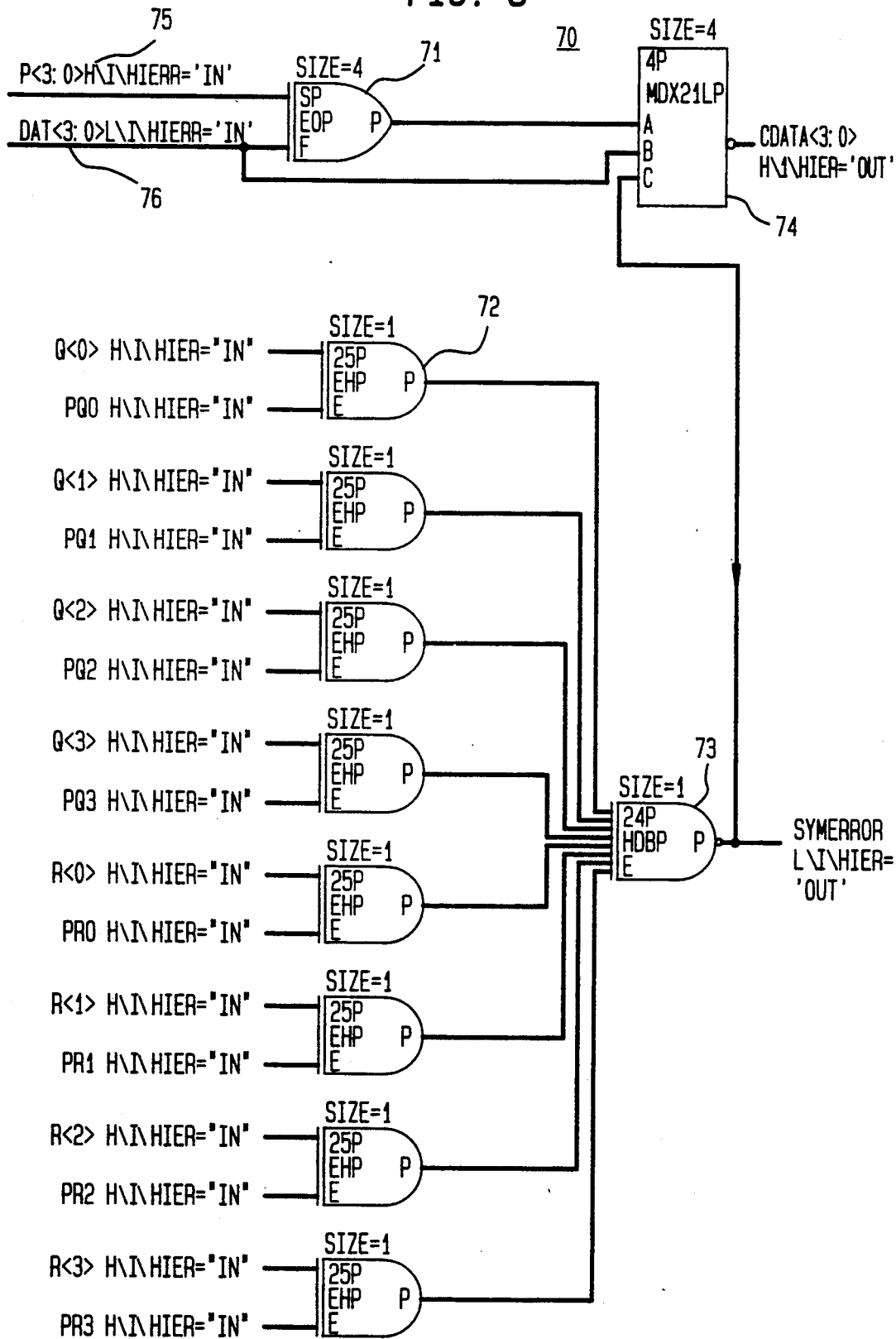
FIG. 5 is an illustration of a correction circuit for a preferred embodiment of the invention.

Referring now to FIG. 5, there is illustrated a corrector circuit 70 for the preferred embodiment of the present invention. The circuit 70 comprises a group of four, two bit wide exclusive OR gates 71, a group of eight XNOR gates 72, an eight bit wide NAND gate 73, and a group of four multiplexers 74. The P syndrome value 75 calculated by other logic and a data symbol 76 are applied to the inputs of the exclusive OR gates 71. The bits of the data symbol are compared with the bits of the P syndrome, bit by bit, in the four exclusive OR gates 71. The outputs of the exclusive OR gates which represents the corrected data obtained by adding (modulo 2), the P syndrome and the data symbol, are coupled to the A inputs of the four multiplexers 74. The data symbol 76 is coupled to the B inputs of the multiplexers 74. The Q and R syndromes and the P syndrome combinations for this symbol are coupled to the inputs of the XNOR gates 72. The output of the NAND gate 73 is coupled to the select inputs of the multiplexers 74.

This corrector circuit 70 is repeated for every data symbol. The P syndrome combinations are compared to the Q syndrome and the R syndrome by XNOR gates 72. The P syndrome combinations that are the subject of the comparison are established by the calculations performed in FIGS. 4A-4C to determine whether an error has occurred in a specific symbol. Thus, the output of the NAND gate 73 indicates that an error has occurred in this symbol. If an error occurs, the output of NAND gate 73 goes low and selects the A inputs of the multiplexers 74 thereby passing the corrected data to the system. If no error occurs, the NAND gate 73 output is high which selects the B inputs of the multiplexers 74 thereby passing the data symbol 76 as read to the system.

For the three check symbols, the invention provides hardware to detect errors in the symbols but the hardware does not attempt to correct the error. There is no reason to correct the check symbols since they are not passed to the rest of the computer system, only data is passed.

Figure 6:
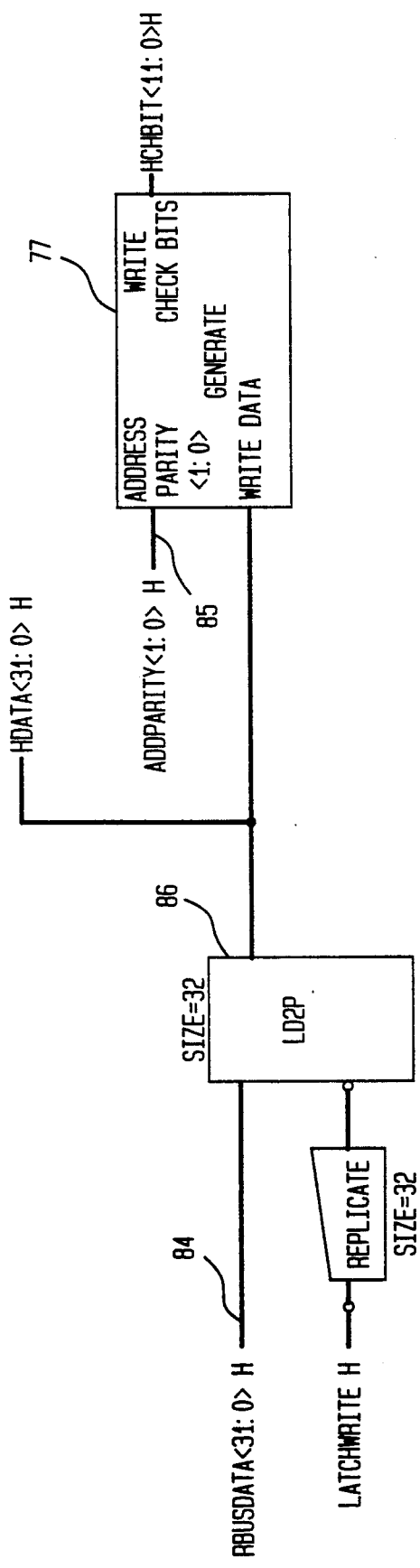
FIG. 6 is an illustration of a check bit generator circuit for a preferred embodiment of the invention.

Referring now to FIG. 6, there is illustrated the logic which is utilized to generate the check bits for a data word before it is stored in memory. The data word 84 is coupled to the input of a latch 86. The output of the latch 86 is coupled to an input of the check bit generation logic device 77. Address parity information 85 is also coupled to an input of the check bit generation logic device 77. The address parity information is calculated in a known manner by the CPU. The check bit generation logic device 77 contains parity trees which generate the check bits. A discussion of the parity trees, which is illustrated in FIG. 8, is set forth in more detail below. The generated check bits are stored in memory along with the data word. Before storing the check bits, a specific set of the check bits are complemented by the check bit generation logic device 77.

Figure 7:
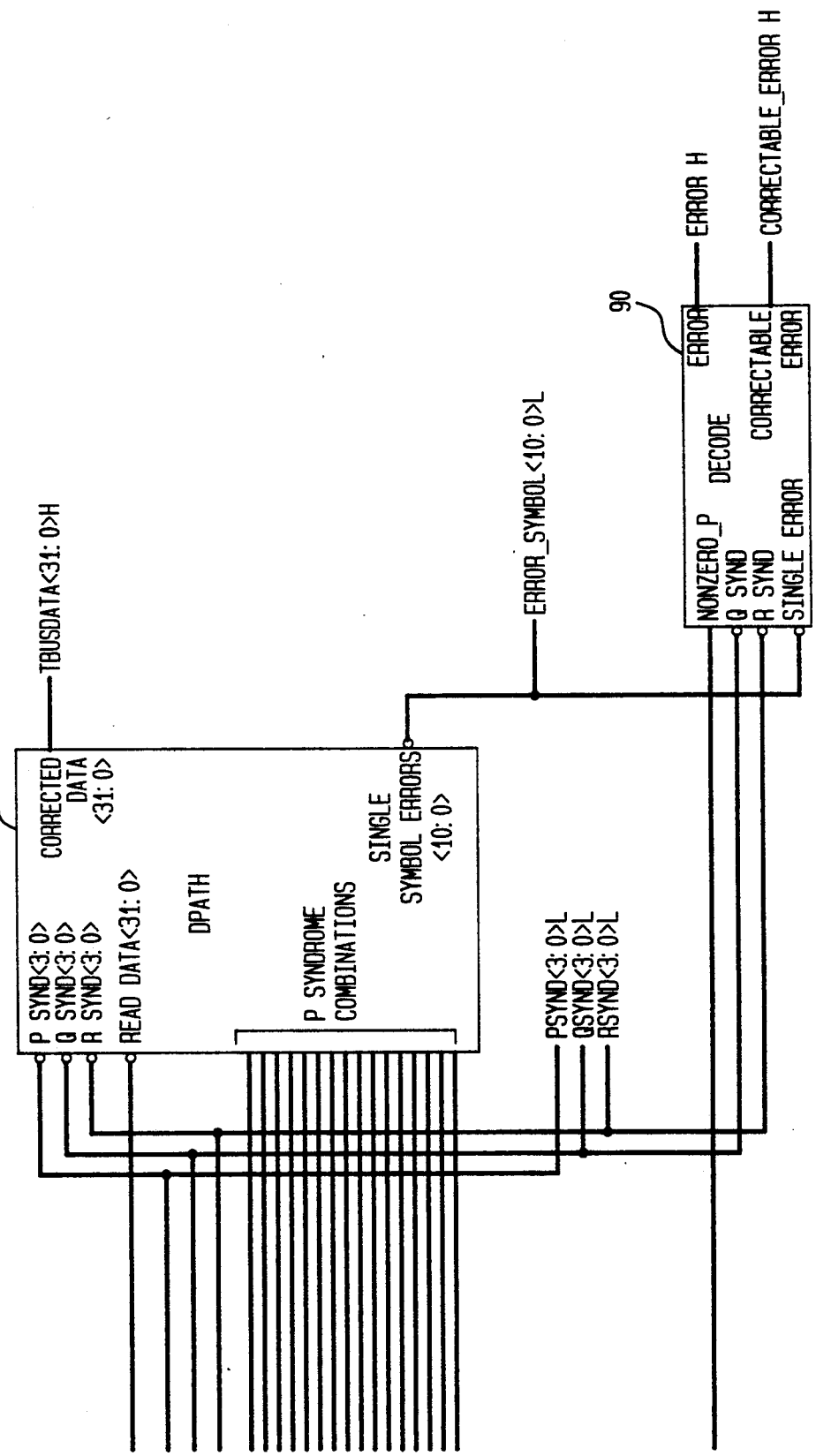
FIG. 7 is an illustration of an error detection and correction circuit for a preferred embodiment of the invention.

Referring now to FIG. 7, there is illustrated the error detection and correction logic utilized when a data word is read from memory. This logic comprises a group of 32 latches 80, three groups of four latches 81, 82 and 83 arranged in parallel, syndrome logic device 79, detection/correction logic device 78 and decode logic device 90. The data word 87 read from memory is coupled to the inputs of the group of 32 latches 80. The three check bit symbols 88, 89 and 91 read from memory with the data word are coupled to the inputs of the three groups of four latches 81, 82 and 83, bit by bit. The outputs of the groups of latches 80, 81, 82 and 83 are coupled to inputs of the syndrome logic device 79. The complemented outputs of groups of four latches 81 and 83 are coupled to the syndrome logic device 79 for reasons that are discussed below. Address parity information 85 which was calculated for the address generated to read the data word from memory is also coupled to an input of the syndrome logic device 78. Outputs of the syndrome logic device 79 are coupled to inputs of the detection/correction logic device 78. Outputs of the group of 32 latches 80 (data word latches) are also coupled to inputs of the detection/correction logic device 78. Outputs of the syndrome logic device 79 are coupled to an input of the decode logic device 90. An output of the error detection/correction logic device 78 is also coupled to the decode logic device 90.

The syndrome logic device 79 contains the parity trees which are used to calculate the syndromes. The data word 87, check bits 88, 89 and 91, and address parity information 85 are passed through the parity trees to generate the syndromes. The syndrome logic device 79 also calculates the P syndrome combinations which are used to ascertain in which symbol an error is located. The use of these P syndrome combinations enhance the speed of the correction/detection calculation as well as simplify the required logic since they require only fifteen separate calculations.

The P, Q and R syndromes and the P syndrome combinations are passed to the detection/correction logic device 78. This logic device 78 contains the corrector circuit 70 shown in FIG. 10, for each symbol. Thus, the actual error detection and correction is performed in this logic device 78.

The decode logic device 90 ascertains whether an error has been detected by reviewing the syndromes. If all the syndromes are zero, no error has occurred. If one or more bits in the syndromes are asserted then there is an error. The outputs of NAND gate 73 of the corrector circuit 70 for each of the symbols are output by the detection/correction logic device 78 to the decode logic device 90. If there is a single error in any of the NAND gate 73 outputs, one of the outputs is low. An uncorrectable error is detected when no outputs are low and one or more syndromes are non-zero. An example of uncorrectable errors are double symbol errors.

The present invention eliminates the need to calculate the entire raw syndromes by calculating the P syndrome combinations and performing the comparison of these combinations with the Q and R syndromes to determine the symbol in error.

An important feature of the present invention is its ability to detect a class of errors that completely escape the standard Reed-Solomon code. Those errors are addressing errors which occur when an incorrect memory location is accessed. It is possible for one or more of the address lines to be faulty thereby causing the entire word accessed from memory to be from a different location than the address requested. Following the error detection and correction scheme outlined above, since the data word would come from a legitimate memory location, all the check bits of the data word will correspond, thus, making it look like good data.

The present invention has incorporated into its error detection and correction scheme the ability to include address parity information into the code. The invention takes the parity of the address and treats it as an additional data symbol. In the preferred embodiment of the present invention, bits two and three of data symbol eleven are used for address parity. This symbol, however, is not stored, but is incorporated into the check bits and the syndromes calculation.

When a memory location is written, for example, location one, a one for the parity of the address bits is included in the check bits calculation. When location one is read, it is known that location one is being read so the expected address parity is known and is included in the parity trees. If there is no error, then the fact that this address parity information went into the check bits and the syndromes calculation has no effect because there is no error in the address.

If check bits and data, originally written to location zero are read from what is thought to be location one, but instead location zero is inadvertently read, then the contribution to the syndromes by the address parity information will be that address being a one, not a zero as originally written for location zero. An error will occur and will point to a symbol that corresponds to an address error symbol instead of one of the data symbols. Address error symbols are always considered to be uncorrectable errors and are detected as such.

Another important feature of the present invention is that yet another class of errors which would be undetected by the standard Reed-Solomon code is detected. This class of errors deals with the catastrophic situation where the data word read is either all ones or all zeros. This situation could occur in a number of situations, for example, where a bus is shorted or where there is a failure in memory control logic. The invention is capable of detecting these errors regardless of the memory address and the address' contribution to the syndromes.

Referring to FIG. 7, there is illustrated how some of the check bits read from memory with a data word are complemented before they are utilized by the syndrome logic device 79. The complemented outputs of the groups of four latches 81 and 83 are fed to the syndrome logic device 79. As discussed earlier, a specific group of check bits are complemented before they are stored in memory. By the proper selection of which check bits are complemented in conjunction with the determination of which check bits are affected by the address parity information, the invention is able to detect the catastrophic error condition. For example, if address location zero contains all zeros the resulting syndromes calculated would result in a zero value, i.e., no error. This situation, however, is avoided by complementing check symbols zero and two. A valid data word of all zeros read from memory, therefore, would have F0F (hexadecimal) for check symbols. This is because the check bit generation logic device 77 complements check symbols zero and two prior to storing them in memory. An invalid data word of all zeros would have all zeros for its check symbols. The error detection and correction logic would detect a multiple symbol and uncorrectable error because the expected check symbols for a valid data word of all zeros is F0F (hexadecimal).

Set forth below in table form are examples of catastrophic error conditions for different address parity. In this table, address parity information is represented by only one bit in the preferred embodiment of the present invention. Such table could be expanded to include all possible combinations of address parity of two bits and catastrophic error data words.

| Data-word | Address Parity | Uncomplemented Check Symbols Generated | Check Symbols Read | Error Status |
|---|---|---|---|---|
| All zeros | 0 | 000 | 000 | no error (1) |
| All zeros | 1 | 8D9 | 000 | uncorrectable error (2) |
| All ones | 0 | 198 | FFF | correctable error (3) |
| All ones | 1 | 941 | FFF | uncorrectable error (4) |

The table sets forth the check symbols generated, the check symbols as read, and the resulting error status for a given data word and address parity. Line one represents the situation described above for an all zero data word. As indicated, no error would be detected. Lines two through four represent the resulting error status for the remaining combination of catastrophic data words and address parity. Line three shows that for a data word of all ones with address parity of zero, a correctable error would be detected. The result would be that the error detection and correction logic would attempt to correct this data word. The present invention overcomes this shortcoming by choosing check symbols zero and two to be stored in memory in complemented form. The table below shows that by complementing these check symbols, the error status for all combinations of catastrophic error data words and address parity information is as an uncorrectable error. Thus, the present invention is capable of accurately detecting catastrophic errors.

| Data-word | Address Parity | Complemented Check Symbols Generated | Check Symbols Read | Error Status |
|---|---|---|---|---|
| All zeros | 0 | F0F | 000 | uncorrectable error |
| All zeros | 1 | 7D6 | 000 | uncorrectable error |
| All ones | 0 | E97 | FFF | uncorrectable error |
| All ones | 1 | 64E | FFF | uncorrectable error |

To fully illustrate the present invention, the following example of calculations of check bits and syndromes for a hypothetical data word is presented.

The data word chosen is represented by eight data symbols and is 00010080 (hexidecimal). The first step is to calculate the check symbols for this data word. For simplicity, a memory address location is chosen which has zero address parity. Referring now to FIGS. 8-8A, there is illustrated in table form, a check bit generation parity tree which is used to ascertain the check symbols. Each symbol in the parity tree is identified by number, i.e., data symbol number 0, data symbol number 1, etc. Referring to line 100, at the first column 101 at the left hand margin there appears a number four. This number indicates that this is the fourth symbol, i.e. J=4, of the data stored in memory. The next column 102 from the left lists 0, 1, 2, 3, which are utilized to determine what is the contribution to the check symbol if bit 0, 1, 2, and/or 3 are set. Thus, if bit 0 of the data symbol four is set, line 100 is used to calculate the contribution to the check symbols. The group of 12 digits to the right of column 102 are the contributions of data symbol four to the check bit calculation with the right most bit representing the least significant bit and the left most bit representing the most significant bit. Starting from the right, the first four bits contribute to check symbol zero, the next four bits contribute to check symbol one, and the last four bits contribute to check symbol two.

Data symbol four has a one in the least significant bit. Referring to line 100 of FIG. 8, data symbol four's contribution to check symbol zero is read. It is determined that data symbol four contributes a $1001_2$, which are the first four bits of line 100, to the calculation of check symbol zero, a $1111_2$ to the calculation of check symbol one, and a $0111_2$ to the calculation of check symbol two.

Data symbol one also contributes to the check symbol calculation since there is a one in its most significant bit. Reading from line 110 of FIG. 8, data symbol one's contributes a $0010_2$ to the calculation of check symbol zero, a $0110_2$ to the calculation of check symbol one, and a $1100_2$ to the calculation of check symbol two.

Data symbol eleven which contains the address parity information does not contribute to the check symbol calculation since the address parity of the memory address chosen is zero. If a memory address were chosen which had nonzero address parity, it then would contribute to the check symbol calculation in the same manner as shown for data symbols one and four. The present invention can utilize either one or two bits for address parity. Referring to data symbol eleven, the address parity bits are represented by lines 111 and 112. If only one bit is used for address parity, both lines 111 and 112 will be utilized in the check symbol calculation if the parity bit is set. If two bits are used, line 111 represents the least significant bit of the address parity and line 112 represents the most significant bit.

The parity tree of FIGS. 8-8A that calculates the check symbols will add (modulo two) each data symbol's contribution to the check symbols for the data word. Performing this addition, check symbol zero is $1011_2$, check symbol one is $1001_2$, and check symbol two is $1011_2$.

The above described function of generating the check bits is accomplished in the check bit generation logic of FIG. 6. After generating the check symbols, the symbols are stored in memory with its associated data word.

The next step is to read the stored data word and check symbols from memory. This information is stored with the three check symbols occupying the first three symbol positions, and then the data symbols. For this example, an error of $1100_2$ will be assumed to be present in data symbol two.

The P syndrome is calculated by adding the data symbols and check symbols. The addition below shows the data symbols and check symbols as read from memory in column form. Performing the modulo two arithmetic to calculate $P_0$ (the least significant bit of the P syndrome) to $P_3$ (the most significant bit of the P syndrome), P is calculated to be $1100_2$. Thus, by calculating the P syndrome, the value of the error has been determined.

|        | $P_3$ | $P_2$ | $P_1$ | $P_0$ |
|--------|-------|-------|-------|-------|
| $CB_0$ = | 1 | 0 | 1 | 1 |
| $CB_1$ = | 1 | 0 | 0 | 1 |
| $CB_2$ = | 1 | 0 | 1 | 1 |
| $D_0$ =  | 0 | 0 | 0 | 0 |
| $D_1$ =  | 1 | 0 | 0 | 0 |
| $D_2$ =  | 1 | 1 | 0 | 0 |
| $D_3$ =  | 0 | 0 | 0 | 0 |
| $D_4$ =  | 0 | 0 | 0 | 1 |
| $D_5$ =  | 0 | 0 | 0 | 0 |
| $D_6$ =  | 0 | 0 | 0 | 0 |
| $D_7$ =  | 0 | 0 | 0 | 0 |
|        | 1 | 1 | 0 | 0 |

The next step is to locate the symbol in which the error is located. This is accomplished by calculating the Q syndrome for the data word as read from memory. The Q syndrome is calculated by utilizing the parity tree list in FIGS. 9-9A.

FIGS. 9-9A are similar to FIGS. 8-8A in that the check symbols and data symbols are identified, the location of the symbol (the J position) is identified, and the bits of each symbol have separate entries. Each of the four twelve bit entries contribute to the Q syndrome calculation if the bit of the entry it represents is set in its corresponding symbol read from memory. The twelve bit entries are divided into groups of four bits. Starting from the right, the first four bits are for the P syndrome calculation, the next four bits are for the Q syndrome calculation, and the last four bits are for the R syndrome calculation.

The Q syndrome is calculated one bit at a time. First, $Q_0$ is calculated by locating the correct column in FIGS. 9-9A, and then looking down the parity tree to see which bits of the data word including the check symbols, must be set to contribute to $Q_0$. This process is repeated for $Q_1$ through $Q_3$ to obtain a value for the Q syndrome.

Performing the Q syndrome calculation, the Q syndrome components are calculated to be $Q_0=1$, $Q_1=1$, $Q_2=1$, and $Q_3=1$. These Q syndrome components are then compared to the P syndrome components, as illustrated in FIGS. 4A-4C, to locate the erroneous symbol. For example, if a single symbol error occurred in symbol zero, the P syndrome components must equal the Q syndrome components. Since $P_0$ does not equal $Q_0$, the error is not in symbol zero. These comparisons continue until a match is found. A match is found at symbol five. Thus, the parity tree and comparison logic has located the error in data symbol two.

The Q syndrome is then compared to the R syndrome to verify that a correctable error, i.e., a single symbol error, has occurred. The R syndrome is calculated in a similar manner as the Q syndrome. If the Q and R syndromes do not match, the error is uncorrectable.

Performing the R syndrome calculation, the R syndrome components are calculated to be $R_0=0$, $R_1=1$, $R_2=1$, and $R_3=1$. Thus, the Q and R syndromes match indicating that a correctable error has been detected.

The next step is to perform an exclusive OR operation on the data symbol in error. The data symbol in error is exclusive ORed with the error value, i.e., the calculated P syndrome, to determine the corrected value. Performing this exclusive OR operation, the corrected value for data symbol two is 0000. Error detection and correction is completed by placing the corrected value for data symbol two in the data word.

If upon reading the data word from memory, an addressing error occurred, an uncorrectable error would be detected. The table below sets forth the contributions of an address parity error to the syndrome calculations. The contributions are ascertained from FIG. 9A under data symbol eleven for bits two and three in the same manner as was done for the other data symbols.

| Error in Address Bit 0 | Error in Address Bit 1 | Contribution to Syndrome calculations | | | Data Symbol Number |
|---|---|---|---|---|---|
| | | R | Q | P | |
| No  | No  | 0 | 0 | 0 | No error (1) |
| No  | Yes | 1 | 2 | 4 | 11 (2) |
| Yes | No  | 2 | 4 | 8 | 11 (3) |
| Yes | Yes | 3 | 6 | C | 11 (4) |

Line one indicates that there is no contribution to the syndrome calculations when there is no address parity error. Lines two through four set forth the contribution to the syndrome calculations when either or both of the address parity bits are in error. The resulting contribution to the syndrome calculations when an error occurs if only one address parity bit is used is set forth in line four since both available bits are used in the preferred embodiment.

The above contributions to the syndrome calculations would indicate a data symbol error in data symbol eleven if an eleven symbol data word were used. Data symbols eight through eleven are unused in the preferred embodiment of the present invention. Thus, there is no hardware in place in the error detection and correction logic to detect and correct such an error. Accordingly, the error is treated as an uncorrectable error.

The above described preferred embodiment of the invention is meant to be representative only, as certain changes may be made therein without departing from the clear teachings of the invention. Accordingly, reference should be made to the following claims which alone define the invention.

What is claimed is:

1. In a digital memory system comprising a central processing unit, a memory array and an error detection and correction logic device, a method for generating a plurality of check symbols used for detecting an address error and detecting and correcting a plurality of bit errors in a data word utilizing a Reed-Solomon code, comprising the steps of:
   a) coupling the memory array and the error detection and correction logic device to the central processing unit;
   b) coupling the memory array to the error detection and correction logic device;
   c) transmitting a first data word and address parity information from the central processing unit to the error detection and correction logic device;
   d) calculating a plurality of check symbols representative of the first data word and the address parity information in the error detection and correction logic device under the control of the Reed-Solomon code using the first data word and the address parity information; and
   e) storing the first data word and the check symbols in the memory array.

2. The method of claim 1 wherein the data word comprises N bits and the steps of transmitting the data word, calculating the plurality of check symbols and storing the data word and check symbols are performed on the N bits in parallel operations.

3. The method of claim 1, further comprising the steps of:
   a) transmitting a data word from an address in the memory array to the error detection and correction logic device, the data word having a plurality of check symbols representative of the data word and the address parity information;
   b) calculating a plurality of syndromes in the error detection and correction logic device pursuant to the Reed-Solomon code as a function of the check symbols and the data word wherein the Reed-Solomon code incorporates the address parity information in the plurality of syndromes;
   c) detecting an address error as a function of the plurality of syndrome; and
   d) generating an uncorrectable error signal upon detecting the address error.

4. The method of claim 1, further comprising the steps of:
   a) transmitting a second data word from an address in the memory array to the error detection and correction logic device, the second data word having a plurality of check symbols representative of the second data word and the address parity information;
   b) calculating a plurality of syndromes in the error detection and correction logic device pursuant to the Reed-Solomon code as a function of the check symbols and the second data word wherein the Reed-Solomon code incorporates the address parity information in the plurality of syndromes;
   c) detecting up to a double symbol error in the second data word when the plurality of syndromes are nonzero and generating an uncorrectable error signal upon detecting a double symbol error; and
   d) correcting a single symbol error in the second data word.

5. In a digital memory system comprising a central processing unit, a memory array and an error detection logic device, a method for detecting an address error utilizing a Reed-Solomon code, comprising the steps of:
   a) coupling the memory array and the error detection logic device to the central processing unit;
   b) coupling the memory array to the error detection logic device;
   c) transmitting a first data word from an address in the memory array to the error detection logic device, the first data word having a plurality of check symbols representative of the first data word and address parity information;
   d) calculating a plurality of syndromes in the error detection logic device pursuant to the Reed-Solomon code as a function of the check symbols and the first data word wherein the Reed-Solomon code incorporates the address parity information in the plurality of syndromes;
   e) detecting an address error as a function of the plurality of syndromes; and
   f) generating an uncorrectable error signal upon detecting the address error.

6. In a digital memory system comprising a central processing unit, a memory array and an error detection and correction logic device, a method for detecting and correcting a plurality of symbol errors in a data word utilizing a Reed-Solomon code, comprising the steps of:
   a) coupling the memory array and the error detection and correction logic device to the central processing unit;
   b) coupling the memory array to the error detection and correction logic device;
   c) transmitting a first data word from an address in the memory array to the error detection and correction logic device, the first data word having a plurality of check symbols representative of the first data word and address parity information;
   d) calculating a plurality of syndromes in the error detection and correction logic device pursuant to the Reed-Solomon code as a function of the check symbols and the first data word wherein the Reed-Solomon code incorporates the address parity information in the plurality of syndromes;
   e) detecting up to a double symbol error in the first data word when the plurality of syndromes are nonzero and generating an uncorrectable error signal upon detecting a double symbol error; and
   f) correcting a single symbol error in the first data word.

7. The method of any one of claims 3, 4, 5 or 6 wherein the data word comprises N bits and the steps of transmitting the data word and calculating the plurality of syndromes are performed on the N bits in parallel operations.

8. In a digital memory system comprising a central processing unit, a memory array and an error detection logic device, a method for generating a plurality of check symbols used for detecting catastrophic error conditions of all ones or all zeros in a data word utilizing a Reed-Solomon code, comprising the steps of:
   a) coupling each of the memory array and the error detection logic device to the central processing unit;
   b) coupling the memory array to the error detection logic device;

c) transmitting a first data word from the central processing unit to the error detection logic device;

d) calculating a plurality of check symbols representative of the first data word in the error detection logic device under the control of the Reed-Solomon code using the first data word;

e) complementing at least one bit in each of two of the plurality of the check symbols to provide two partially complemented check symbols; and f) storing the first data word and the plurality of check symbols including the two partially complemented check symbols in the memory array at an address generated by the central processing unit.

9. The method of claim 8 wherein the first data word comprises N bits and the steps of transmitting the first data word, calculating the plurality of check symbols, complementing the at least one bit in each of two of the plurality of check symbols and storing the first data word and plurality of check symbols are performed on the N bits in parallel operations.

10. The method of according to claim 8, further comprising the steps of:

a) transmitting a second data word from an address in the memory array to the error detection logic device, the second data word comprising a plurality of check symbols wherein two of the plurality of check symbols having at least one bit in each of two of the plurality of check symbols complemented to provide two partially complemented check symbols, the plurality of check symbols being representative of the second data word;

b) complementing the at least one bit of the two partially complemented check symbols;

c) calculating a plurality of syndromes in the error detection logic device pursuant to the Reed-Solomon code as a function of the check symbols and the second data word;

d) detecting a data word of all zeros or all ones as a function of the complement of the two partially complemented check symbols; and e) generating a signal indicating an uncorrectable error when the data word is either all zeros or all ones and the plurality of syndromes indicate that the check symbols for the data word are not representative of a data word of all zeros or all ones.

11. In a digital memory system comprising a central processing unit, a memory array and an error detection logic device, a method for detecting catastrophic error conditions of all ones or all zeros in a data word utilizing a Reed-Solomon code, comprising the steps of:

a) coupling each of the memory array and the error detection logic device to the central processing unit;

b) coupling the memory array to the error detection logic device;

c) transmitting a first data word from an address in the memory array to the error detection logic device, the first data word comprising a plurality of check symbols wherein two of the plurality of check symbols having at least one bit in each of two of the plurality of check symbols complemented to provide two partially complemented check symbols, the plurality of check symbols being representative of the first data word;

d) complementing the at least one bit of the two partially complemented check symbols;

e) calculating a plurality of syndromes in the error detection logic device pursuant to the Reed-Solomon code as a function of the check symbols and the first data word;

f) detecting a data word of all zeros or all ones as a function of the complement of the two partially complemented check symbols; and g) generating a signal indicating an uncorrectable error when the data word is either all zeros or all ones and the plurality of syndromes indicate that the check symbols for the data word are not representative of a data word of all zeros or all ones.

12. The method of any one of claims 10 or 11 wherein the data word comprises N bits and the steps of transmitting the data word, complementing the at least one bit in each of the two partially complemented check symbols, calculating the plurality of syndromes and detecting a data word of all zeros or all ones are performed on the N bits in parallel operations.

13. In a digital memory system comprising a central processing unit, a memory array and an error detection logic device, a method for generating a plurality of check symbols used for detecting catastrophic error conditions of all ones or all zeros in a data word and detecting address errors utilizing a Reed-Solomon code, comprising the steps of:

a) coupling each of the memory array and the error detection logic device to the central processing unit;

b) coupling the memory array to the error detection logic device;

c) transmitting a first data word and address parity information from the central processing unit to the error detection logic device;

d) calculating a plurality of check symbols representative of the first data word and the address parity information in the error detection logic device under the control of the Reed-Solomon code using the first data word;

e) complementing at least one bit in each of two of the plurality of the check symbols to provide two partially complemented check symbols; and f) storing the first data word and the plurality of check symbols including the two partially complemented check symbols in the memory array at the address generated by the central processing unit.

14. The method of claim 13 wherein the first data word comprises N bits and the steps of transmitting the first data word, calculating the plurality of check symbols, complementing the at least one bit in each of two of the plurality of check symbols and storing the first data word and plurality of check symbols are performed on the N bits in parallel operations.

15. The method according to claim 13, further comprising the steps of:

a) transmitting a second data word from an address in the memory array to the error detection logic device, the second data word comprising a plurality of check symbols wherein two of the plurality of check symbols having at least one bit complemented to provide two partially complemented check symbols, the plurality of check symbols being representative of the second data word and the address parity information;

b) complementing the at least one bit of the two partially complemented check symbols;

c) calculating a plurality of syndromes in the error detection logic device pursuant to the Reed-Solomon code as a function of the check symbols and the second data word wherein the Reed-Solomon code incorporates the address parity information in the plurality of syndromes;

d) detecting a data word of all zeros or all ones as a function of the complement of the two partially complemented check symbols;

e) detecting an address error as a function of the plurality of syndromes; and f) generating a signal indicating an uncorrectable error when the data word is either all zeros or all ones and the plurality of syndromes indicate that the check symbols for the data word are not representative of a data word of all zeros or all ones and upon detecting the address error.

16. In a digital memory system comprising a central processing system, a memory array and an error detection logic device, a method for detecting catastrophic error conditions of all ones or all zeros in a data word and detecting an address error utilizing a Reed-Solomon code, comprising the steps of:

a) coupling each of the memory array and the error detection logic device to the central processing unit;

b) coupling the memory array to the error detection logic device;

c) transmitting a first data word from an address in the memory array to the error detection logic device, the first data word having a plurality of check symbols including two of the plurality of check symbols each having at least one bit complemented to provide two partially complemented check symbols, the plurality of check symbols being representative of the first data word and address parity information;

d) complementing the at least one bit of the two partially complemented check symbols;

e) calculating a plurality of syndromes in the error detection logic device pursuant to the Reed-Solomon code as a function of the plurality of check symbols and the first data word wherein the Reed-Solomon code incorporates address parity information in the plurality of syndromes;

f) detecting a data word of all zeros or all ones as a function of the complement of the two partially complemented check symbols;

g) detecting an address error as a function of the plurality of syndromes; and h) generating a signal indicating an uncorrectable error when the data word is either all zeros or all ones and the plurality of syndromes indicate that the check symbols for the data word are not representative of a data word of all zeros or all ones and upon detecting the address error.

17. The method of any one of claims 15 or 16 wherein the data word comprises N bits and the steps of transmitting the data word, complementing the at least one bit of the two partially complemented check symbols, calculating the plurality of syndromes, detecting a data word of all zeros or all ones and detecting an address error are performed on the N bits in parallel operations.

18. A digital memory system comprising:
a memory array;
an error detection and correction logic device coupled to the memory array;
an input device coupled to the memory array and the error detection and correction logic device, to transmit a data word and address parity information;

the error detection and correction logic device to calculate a plurality of check symbols representative of the data word and the address parity information under control of a Reed-Solomon code using the data word and the address parity information.

19. The digital memory system of claim 18 wherein the data word comprises N bits, the input device transmits the N bits in a parallel operation and the error detection and correction logic device includes parallel logic to calculate the plurality of check symbols.

20. The digital memory system of claim 18, further comprising:
the input device to transmit a data word from an address in the memory array to the error detection and correction logic device, the data word having a plurality of check symbols representative of the data word and the address parity information;
the error detection and correction logic device to calculate a plurality of syndromes under control of a Reed-Solomon code using the data word and the address parity information; and
the error detection and correction logic device to detect an address error as a function of the plurality of syndromes and generate an uncorrectable error signal upon detecting the address error.

21. The digital memory system of claim 18, further comprising:
the input device to transmit a data word from an address in the memory array to the error detection and correction logic device, and data word having a plurality of check symbols representative of the data word and the address parity information;
the error detection and correction logic device to calculate a plurality of syndromes under control of a Reed-Solomon code using the data word and the address parity information; and
the error detection and correction logic device to detect up to a double symbol error in the data word and generate an uncorrectable error signal upon detecting a double symbol error and correct a single symbol error in the data word upon detecting a single symbol error as a function of the plurality of syndromes.

22. The digital memory system of any one of claims 20 or 21 wherein the data word comprises N bits, the input device includes parallel logic to transmit the N bits and the error detection and correction logic device includes parallel logic to calculate the plurality of syndromes.

23. A digital memory system comprising:
a memory array;
an error detection and correction logic device coupled to the memory array;
an input device transmitting a data word from an address in the memory array to the error detection and correction logic device, the data word having a plurality of check symbols representative of the data word and address parity information;
the error detection and correction logic device to calculate a plurality of syndromes under control of a Reed-Solomon code as a function of the check symbols and the data word using the data word and the address parity information;
the error detection and correction logic device to detect an address error as a function of the plurality of syndromes and generate an uncorrectable error signal upon detecting the address error.

24. A digital memory system comprising:
a memory array;
an error detection and correction logic device coupled to the memory array;
an input device to transmit a data word from an address in the memory array to the error detection and correction logic device, the data word having a plurality of check symbols representative of the data word and address parity information;
the error detection and correction logic device to calculate a plurality of syndromes under control of a Reed-Solomon code as a function of the check symbols and the data word using the data word and the address parity information;
the error detection and correction logic device to detect up to a double symbol error in the data word and generate an uncorrectable error signal upon detecting a double symbol error and correct a single symbol error in the data word upon detecting a single symbol error as a function of the plurality of syndromes.

25. The digital memory system of any one of claims 23 or 24 wherein the data word comprises N bits, the input device includes parallel logic to transmit the N bits and the error detection and correction logic device includes parallel logic to calculate the plurality of syndromes.

26. A digital memory system comprising:
a memory array;
an error detection logic device coupled tot he memory array;
an input device coupled to the memory array and the error detection logic device, the input device to transmit a data word to the error detection logic device;
the error detection logic device to calculate a plurality of check symbols representative of the data word under control of a Reed-Solomon code using the data word, to complement at least one bit in each of two of the plurality of check symbols to provide two partially complemented check symbols and to store the data word and the plurality of check symbols including the two partially complemented check symbols in the memory array at an address generated by the input device.

27. The digital memory system of claim 26 wherein the data word comprises N bits, the input device transmits the N bits in a parallel operation, and the error detection logic device includes parallel logic to calculate the plurality of check symbols, complement the at least one bit in the each of two of the plurality of check symbols and store the data word and the plurality of check symbols.

28. The digital memory system of claim 21, further comprising:
the input device to transmit a data word from an address in the memory array to the error detection logic device, the data word having a plurality of check symbols including two of the plurality of check symbols each having at least one bit complemented to provide two partially complemented check symbols, the plurality of check symbols being representative of the data word;
the error detection logic device to complement the at least one bit of the two partially complemented check symbols and to calculate a plurality of syndromes under control of a Reed-Solomon code using the data word; and the error detection logic device to detect a data word of all zeros or all ones as a function of the two partially complemented check symbols and generate an uncorrectable error signal when the plurality of syndromes indicate that the check symbols for the data word are not representative of a data word of all zeros or all ones.

29. A digital memory system comprising:
a memory array;
an error detection logic device coupled to the memory array;
an input device coupled to the memory array and the error detection logic device, to transmit a data word from an address in the memory array to the error detection logic device, the data word having a plurality of check symbols including two of the plurality of check symbols each having at least one bit complemented to provide two partially complemented check symbols, the plurality of check symbols being representative of the data word;
the error detection logic device to complement the at least one bit of the two partially complemented check symbols and to calculate a plurality of syndromes under control of a Reed-Solomon code as a function of the check symbols and the data word using the data word;
the error detection logic device to detect a data word of all zeros or all ones as a function of the two partially complemented check symbols and generate an uncorrectable error signal when the plurality of syndromes indicate that the check symbols for the data word are not representative of a data word of all zeros or all ones.

30. The digital memory system of any one of claims 28 or 29 wherein the data word comprises N bits, the input device includes parallel logic to transmit the N bits and the error detection and correction logic device includes parallel logic to complement the at least one bit of the two partially complemented check symbols, to calculate the plurality of syndromes and to detect a data word of all zeros or all ones.

31. A digital memory system comprising:
a memory array;
an error detection logic device coupled to the memory array;
an input device coupled to the memory array and the error detection logic device, the input device to transmit a data word and address parity information to the error detection logic device;
the error detection logic device to calculate a plurality of check symbols representative of the data word and the address parity information under control of a Reed-Solomon code using the data word and the address parity information, to complement at least one bit in each of two of the plurality of check symbols to provide two partially complemented check symbols and to store the data word and the plurality of check symbols including the two partially complemented check symbols in the memory array at an address generated by the input device.

32. The digital memory system of claim 31 wherein the data word comprises N bits, the input device transmits the N bits in a parallel operation, and the error detection logic device includes parallel logic to calculate the plurality of check symbols, complement the at least one bit in the each of two of the plurality of check symbols and store the data word and the plurality of check symbols.

33. The digital memory system of claim 31, further comprising:

the input device to transmit a data word from an address in the memory array to the error detection logic device, the data word having a plurality of check symbols including two of the plurality of check symbols each having at least one bit complemented to provide two partially complemented check symbols, the plurality of check symbols being representative of the data word and the address parity information;

the error detection logic device to complement the at least one bit of the two partially complemented check symbols and to calculate a plurality of syndromes under control of a Reed-Solomon code using the data word and the address parity information; and the error detection logic device to detect a data word of all zeros or all ones as a function of the two partially complemented check symbols and to detect an address error and generate and uncorrectable error signal when the plurality of syndromes indicate that the check symbols for the data word are not representative of a data word of all zeros or all ones and upon detecting an address error.

34. A digital memory system comprising:

a memory array;

an error detection logic device coupled to the memory array;

an input device coupled to the memory array and the error detection logic device, to transmit a data word from an address in the memory array to the error detection logic device, the data word having a plurality of check symbols including two of the plurality of check symbols each having at least one bit complemented to provide two partially complemented check symbols, the plurality of check symbols being representative of the data word and address parity information;

the error detection logic device to complement the at least one bit of the two partially complemented check symbols and to calculate a plurality of syndromes under control of a Reed-Solomon code as a function of the check symbols and the data word using the data word and the address parity information;

the error detection logic device to detect a data word of all zeros or all ones as a function of the two partially complemented check symbols and to detect an address error and generate an uncorrectable error signal when the plurality of syndromes indicate that the check symbols for the data word are not representative of a data word of all zeros or all ones and upon detecting an address error.

35. The digital memory system of any one of claims 33 or 34 wherein the data word comprises N bits, the input device includes parallel logic to transmit the N bits and the error detection logic device includes parallel logic to complement the at least one bit of the two partially complemented check symbols, to calculate the plurality of syndromes, to detect a data word of all zeros or all ones and to detect an address error.

* * * * *